(12) United States Patent
Takeuchi et al.

(10) Patent No.: US 7,564,051 B2
(45) Date of Patent: Jul. 21, 2009

(54) THIN-FILM TRANSISTOR INCLUDING ORGANIC SEMICONDUCTOR AND INORGANIC PARTICLES, AND MANUFACTURING METHOD THEREFOR

(75) Inventors: Takayuki Takeuchi, Ibaraki (JP); Norishige Nanai, Hirakata (JP)

(73) Assignee: Panasonic Corporation, Osaka (JP)

( * ) Notice: Subject to any disclaimer, the term of this patent is extended or adjusted under 35 U.S.C. 154(b) by 543 days.

(21) Appl. No.: 10/564,754

(22) PCT Filed: Jul. 15, 2004

(86) PCT No.: PCT/JP2004/010436

§ 371 (c)(1),
(2), (4) Date: Jan. 17, 2006

(87) PCT Pub. No.: WO2005/008785

PCT Pub. Date: Jan. 27, 2005

(65) Prior Publication Data

US 2006/0177972 A1    Aug. 10, 2006

(30) Foreign Application Priority Data

Jul. 17, 2003    (JP)    ................ 2003-275895

(51) Int. Cl.
H01L 23/48    (2006.01)
(52) U.S. Cl. .................... 257/40; 257/E51.005; 438/99
(58) Field of Classification Search .................. 257/40, 257/E51.005; 438/99
See application file for complete search history.

(56) References Cited

U.S. PATENT DOCUMENTS

| 5,989,945 | A | * | 11/1999 | Yudasaka et al. | ............ 438/149 |
| 2002/0084504 | A1 | * | 7/2002 | Narayan | ............ 257/462 |
| 2002/0094639 | A1 | * | 7/2002 | Reddy | ............ 438/257 |
| 2002/0119584 | A1 | * | 8/2002 | Duthaler et al. | ............ 438/21 |
| 2003/0080426 | A1 | * | 5/2003 | Klauk et al. | ............ 257/744 |

FOREIGN PATENT DOCUMENTS

| CN | 1602551 | 3/2005 |
| JP | 06-273811 | 9/1994 |
| JP | 2000-260999 | 9/2000 |
| JP | 2002-204012 | 7/2002 |
| JP | 2004-088090 | 3/2004 |
| WO | WO 2004/006337 A1 | 1/2004 |

OTHER PUBLICATIONS

Chinese Office Action, with English Translation, issued in Chinese Patent Application No. CN 200480020581X, dated Apr. 4, 2008.

* cited by examiner

Primary Examiner—Thomas L Dickey
(74) Attorney, Agent, or Firm—McDermott Will & Emery LLP

(57) ABSTRACT

A thin-film transistor (100) of the present invention comprises a semiconductor layer (4), and a source region (5), a drain region (6), and a gate region (2) which formed on the semiconductor layer to be separated from each other. Said semiconductor layer is made of composite material, and said composite material comprises organic semiconductive material and at least one kind of inorganic material particles dispersed inside the organic semiconductive material.

16 Claims, 19 Drawing Sheets

| P-type silicon crystal 1 Average particle diameter 20 μm (volume%) | P-type silicon crystal 2 Average particle diameter 1.5 μm (volume%) | Total filling rate (volume%) |
|---|---|---|
| 0 | 0 | 0 |
| 10 | 0 | 10 |
| 20 | 0 | 20 |
| 40 | 0 | 40 |
| 40 | 15 | 55 |
| 40 | 20 | 60 |
| 40 | 25 | 65 |

| P-type silicon crystal 1 Average particle diameter 20 μm (volume%) | P-type silicon crystal 2 Average particle diameter 1.5 μm (volume%) | Total filling rate (volume%) |
|---|---|---|
| 0 | 0 | 0 |
| 10 | 0 | 10 |
| 20 | 0 | 20 |
| 40 | 0 | 40 |
| 40 | 15 | 55 |
| 40 | 20 | 60 |
| 40 | 25 | 65 |

Fig. 5

| Cu particle 1<br>Average particle diameter<br>10 μm (volume%) | Cu particle 2<br>Average particle diameter<br>1 μm (volume%) | Total filling rate<br>(volume%) |
|---|---|---|
| 0 | 0 | 0 |
| 10 | 0 | 10 |
| 30 | 0 | 30 |
| 40 | 5 | 45 |
| 40 | 20 | 60 |

Fig. 10

|  | P-type silicon crystal 1 Average particle diameter 20 μm (volume%) | Cu particle 2 Average particle diameter 1 μm (volume%) | Total filling rate (volume%) | Carrier mobility $(cm^2/V_s)$ | Cutoff frequency (kHz) |
|---|---|---|---|---|---|
| 1st embodiment | 40 | 0 | 40 | 1.4 | 2.2 |
| 3rd embodiment(1) | 40 | 5 | 45 | 1.9 | 4.7 |
| 3rd embodiment(2) | 40 | 10 | 50 | 2.5 | 8.5 |

Fig. 13

ID
THIN-FILM TRANSISTOR INCLUDING ORGANIC SEMICONDUCTOR AND INORGANIC PARTICLES, AND MANUFACTURING METHOD THEREFOR

RELATED APPLICATION

This application is a national phase of PCT/JP2004/010436 filed on Jul. 15, 2004, which claims priority from Japanese Application No. 2003-275895 filed on Jul. 17, 2003, the disclosures of which Applications are incorporated by reference herein. The benefit of the filing and priority dates of the International and Japanese Applications is respectfully requested.

1. Technical Field

The present invention relates to a thin-film transistor and a method for manufacturing the same, and particularly to a thin-film transistor wherein inorganic material particles are dispersed inside an organic semiconductor to form a semiconductor layer, and a method for manufacturing the same.

2. Background Art

At present, a thin-film transistor (hereinafter referred to as TFT) is suitably used as a drive element in an active matrix liquid crystal display and the like. Various configurations of TFT have been proposed. However, basically, electric current flowing between a source electrode and a drain electrode which are in contact with a semiconductor layer is controlled by voltage (i.e. an electric field produced by applied voltage) applied to a gate electrode which is provided for the semiconductor layer with an insulating layer interposed between them. With regard to the semiconductor layer of TFT, a semiconductive material in practical use at present is an inorganic semiconductor such as amorphous silicon and low-temperature polysilicon which are poorer than a crystalline silicon in property but relatively inexpensive. With regard to an insulating layer provided with a gate electrode, insulation materials in practical use at present are oxide silicon, silicon nitride and the like. However, the process of manufacturing TFT using these semiconductive materials and insulation materials requires large-scale devices for plasma CVD method and expensive thin-film control devices for high-precision process. For this reason, a manufacturing cost of the TFT becomes high. Further, available substrate materials are limited because the above-mentioned plasma CVD method typically includes a step using processing temperature of higher than 350° C.

Attention is currently focused on an organic semiconductor formed of an organic compound as an available semiconductive material for TFT. This organic semiconductor allows us to employ low cost processes such as spin coating, inkjet printing, and immersion coating to form TFT semiconductor layer. Therefore, it makes TFT manufacturing cost lower than employing inorganic semiconductive materials such as above-mentioned amorphous silicon and low-temperature polysilicon. Because those low cost processes are also low-temperature processes, it is possible to solve the limitation of available substrate material and the like. Further, it is possible to realize forming TFT on flexible substrates and large area substrates because low-cost processes (low-temperature process) such as spin coating are applicable to formation of semiconductor layer using an organic semiconductor. Thereby application to large screen displays, sheet-like or paper-like displays, or radio ID tag may be expected to be expanded.

However, the organic semiconductor currently reported is lower in carrier mobility than inorganic semiconductors such as amorphous silicon and low-temperature polysilicon. To realize the carrier mobility as high as that of amorphous silicon using organic semiconductors, there is only means of highly orientation-controlling small molecule or short-chain oligomer of an organic semiconductor in the semiconductor layer. This can not be realized by the above-mentioned low-cost process.

To realize the carrier mobility of amorphous silicon and the low-cost process at the same time, an organic/inorganic hybrid semiconductive material, a mixture of inorganic semiconductor and organic material, is proposed (for example, Japanese Published Unexamined Application: 2000-260999).

In this organic/inorganic hybrid semiconductive material, organic material (organic ingredient) and inorganic semiconductor (inorganic ingredient) are mixed with each other at a molecular level. And utilizing the characteristics where organic ingredient and inorganic ingredient are self assembled (self-crystallized) with each other, inorganic ingredient of semiconductor forms a highly-oriented solid crystal thin film therein. Thereby the organic/inorganic hybrid semiconductive material realizes high carrier mobility. Forming a semiconductor layer with the organic/inorganic hybrid semiconductive material enables formation of TFT by low-cost process (low-temperature process) such as spin coating. This makes it possible to lower TFT manufacturing cost and solve restrictions of available substrate materials. It is possible to construct TFT with high carrier mobility because the semiconductor layer has inorganic semiconductor solid crystal. That means, high carrier mobility and low-cost process are both realized.

A large display, a sheet-like display and a paper-like display are current trends of technology regarding flat panel display. To realize these trends of technology, light weight, mechanical flexibility and impact resistance are required for a substrate forming these displays. Therefore, TFT formed on the substrate forming the displays requires light weight, mechanical flexibility and impact resistance as well. TFT which can be manufactured inexpensively is expected to be applied to RFID tag. In that case, in order to meet requirements of various shapes and materials, light weight, mechanical flexibility and impact resistance are also required.

While the current proposition using the above-mentioned organic/inorganic hybrid semiconductive material solves the problem of realizing both high carrier mobility and low cost process at the same time, a semiconductor network forming a channel between a source electrode and a drain electrode is formed only of crystalline solid thin film of inorganic semiconductor. Therefore, the latter is light but it has problem in reliability of mechanical flexibility and impact resistance. That means, when TFT is formed on a plastic substrate as a flexible substrate using an organic/inorganic hybrid semiconductive material, bending durability of TFT is extremely low, comparing with a case where TFT is formed of the organic semiconductor.

DISCLOSURE OF THE INVENTION

A primary object of the present invention is to provide a TFT which is formed by low cost process, is superior in mechanical flexibility and impact resistance and has high carrier mobility, and a method of manufacturing the same.

A secondary object of the present invention is to provide an active matrix display provided with said TFTs, a radio ID tag using said TFT for an integrated circuit portion, portable devices such as a portable TV, a communications terminal, PDA, and a portable medical device which uses said TFT for integrated circuit portions.

In order to realize these objects, TFT of the present invention comprises a semiconductor layer, and a source region, a drain region, and a gate region which are formed on the semiconductor layer to be separated from each other; wherein said semiconductor layer is made of a composite material, and said composite material comprises organic semiconductive material and at least one kind of inorganic material particles dispersed inside the organic semiconductive material. The concept here in this description is that the source region and the drain region are referred to the source electrode and the drain electrode, and they also include the contact layer or the concentrated impurity region (layer) which contact the semiconductor layer with the source electrode and the drain electrode. With this configuration where the semiconductor layer comprises organic semiconductive material and inorganic material particles, when conductive material is used as inorganic material, many regions of low electric resistance, or many regions of high carrier mobility, are formed inside the semiconductor layer. Therefore, this configuration can realize higher carrier mobility in the semiconductor layer as a whole than the configuration where the semiconductor layer is formed of single organic semiconductive material.

In this case, it is preferable to take the configuration where electric resistance of said inorganic material is lower than that of said organic semiconductive material, during ON operation of the thin-film transistor. By these configurations, with regard to the semiconductor layer comprising organic semiconductive material and inorganic material particles, when using such material that electric resistance of the inorganic material is lower than that of the organic semiconductive material during ON operation of the thin-film transistor, the region of lower electric resistance, or the region of higher carrier mobility, can be formed inside the semiconductor layer. Therefore, it is possible to realize higher carrier mobility in the semiconductor layer as a whole than the semiconductor layer formed of single organic semiconductive material.

Further, in the present invention, it is preferable that the maximum particle diameter of said particle is smaller than a distance between said source region and said drain region. With this configuration, even if the inorganic material is conductive, the source region and the drain region are prevented from electric short circuit by single inorganic material particle. And when inorganic material is semiconductive, TFT can be operated even if the source region and the drain region are electrically connected by single inorganic material. However, in the case of the conventional TFT which is formed by single semiconductor as inorganic material, mechanical flexibility and impact resistance are inferior to the TFT using organic semiconductive material. Therefore, with the above preferable configuration, even if inorganic material is semiconductive, because inorganic semiconductive material exists inside the organic semiconductive material having flexibility, it is possible to realize TFT having satisfying mechanical flexibility and impact resistance.

Further, in the present invention, it is preferable to take the configuration wherein the content rate of said particles in said semiconductor layer is restricted so as to inhibit electrical connection by a network of said particles between said source region and said drain region. With this configuration, even if the inorganic material is conductive, a distance between the source region and the drain region is prevented from electrical short circuit by the network where inorganic material particles are connected with each other. In the case that the inorganic material is semiconductive, even if the source region and the drain region are electrically connected by the network where inorganic material particles ere connected with each other, TFT can be operated but stable property of the TFT can not be obtained because said network is inferior in mechanical flexibility and impact resistance. Therefore, with the above preferable configuration, even if the inorganic material is semiconductive, it is possible to realize TFT having sufficient mechanical flexibility and impact resistance because inorganic semiconductive material exists inside the organic semiconductive material having flexibility.

In this case, it is preferable to take the configuration where said content rate is more than 0 volume % and not more than 60 volume %. This configuration makes it possible to effectively limit the contact rate between inorganic material particles which are dispersed inside the organic semiconductive material.

Further, in the present invention, a group of said dispersed particles comprises at least first particle group and second particle group, having different average particle diameters. This configuration easily increases the filling rate of inorganic material particles inside the organic semiconductive material, and then make it possible to realize higher carrier mobility in the semiconductor layer as a whole.

In this case, it is preferable to take configuration where an average particle diameter of said first particle group is more than 0% and less than 15% of an average particle diameter of said second particle group. This configuration makes it possible to easily raise the filling rate of inorganic material particles inside the organic semiconductive material.

Further, in the present invention, it is preferable to take the configuration where said inorganic material is a conductive material. With the configuration where inorganic material is conductive, semiconductor property of TFT appears only by organic semiconductive material. The conductive material is dispersed inside the semiconductor layer, and an effective channel length between the source region and the drain region decreases. This makes it possible to improve the carrier mobility in the semiconductor layer as a whole. And decreasing the effective channel length improves cutoff frequency.

Further, in the present invention, it is preferable that said inorganic material is a semiconductive material. With this configuration where inorganic material is semiconductive, even if filling rate of the inorganic material particles is fully increased, there is no risk that the source region and the drain region are conducted. Thereby, it is possible to realize the stable TFT having high carrier mobility.

Further, in the present invention, it is preferable to take the configuration wherein said inorganic material is composite of two or more materials containing a conductive material and a semiconductive material. With this configuration, when the inorganic material is composite of two or more materials, one of which is conductive and the other is semiconductive, it is possible to obtain both effects of the case that inorganic material is semiconductive alone and the case that inorganic material is conductive alone.

Further, in the present invention, a method of manufacturing TFT which comprises a semiconductor layer, source region, a drain region and a gate region which are formed on the semiconductor layer to be separated from each other comprises a first step of forming composite material by dispersing at least one kind of inorganic material particles inside an organic semiconductive material, and a second step of forming said semiconductor layer using said composite material produced in the first step. With this configuration where the semiconductor layer has organic semiconductive material and inorganic material particles, when the inorganic material is conductive, many regions of low electric resistance, or high carrier mobility, are provided inside the semiconductor layer, it is possible to produce TFT where the semiconductor layer as a whole has higher carrier mobility than the configuration where the semiconductor layer is formed by organic semiconductive material alone.

In this case, it is preferable to take the configuration wherein an electric resistance of said inorganic material is lower than that of said organic semiconductive material, during ON operation of the thin-film transistor. With this configuration where the semiconductor layer has organic semiconductive material and inorganic material particles, when the electric resistance of said inorganic material is lower than that of said organic semiconductive material, during ON operation of the thin-film transistor, it is possible to produce TFT where many regions of lower electric resistance, or higher carrier mobility, are provided inside the semiconductor layer as a whole, comparing to the configuration where the semiconductor layer is formed by the organic semiconductive material alone.

Further, in the present invention, it is preferable to comprise a step of selecting particles so as to form a predetermined particle size distribution. With this configuration, the particle size distribution of inorganic material particles dispersed inside the organic semiconductive material can be controlled into a predetermined particle size distribution. It is possible to produce TFT which has small property difference.

Further, in the present invention, it is preferable to comprise a step of controlling dispersion so as to form a predetermined particle dispersion state in said semiconductor layer. With this configuration, the dispersion state of inorganic material particles dispersed inside the organic semiconductive material is controlled to a predetermined dispersion state. Thereby it is possible to produce TFT which has small property difference.

Further, in the present invention, it is preferable to take the configuration where said second step further comprises a first preparation step of dispersing said composite material in a predetermined solution dissolved or undissolved to obtain a semiconductor layer forming material, and a second preparation step of atomizing, coating, or printing said semiconductor layer forming material prepared in said first preparation step to a predetermined location, and then drying the material to form said semiconductor layer. With this configuration, it is possible to produce TFT by the low cost process.

Further, the thin-film transistors of the present invention are used as active matrix display, and the thin-film transistors according to any one of Claims 1 to 10 are provided as switching elements to drive pixels. With this configuration, it is possible to realize a sheet-like or a paper-like active matrix display which has good property and are inexpensive.

Further, the thin-film transistors of the present invention are used for the radio ID tag, and the thin-film transistors according to any one of Claims 1 to 10 are used as a semiconductor device to form integrated circuits. With this configuration, it is possible to adhere the radio ID tag to various shaped objects and the materials. And it is to realize the radio ID tag in any shape.

Further, portable devices uses thin-film transistors of the present invention, and the thin-film transistors according to any one of Claims 1 to 10 are used as semiconductor devices to form integrated circuits. Though, the portable devices include portable TV, communications terminal, PDA, an portable medical devices here, it is not limited to these portable devices. For example, any portable devices such as portable AV devices, and portable computers are included. With this configuration, it is possible to add advantages such as low cost, flexibility, impact resistance, and forming in any shapes to the portable devices such as portable TV, communication terminal, PDA, and portable medical devices.

The above objects, the other objects, features, and advantages of the present invention will be illustrated from below-mentioned detailed description of preferred embodiments with reference to drawings.

BRIEF DESCRIPTION OF THE DRAWINGS

FIG. 5 is a combination diagram showing particle kinds of P-type silicon crystal, individual particle content rate in oligothiophene, and total filling rate of entire particles in oligothiopene, in the first embodiment.

FIG. 10 is a combination diagram showing kinds of Cu particle, individual particle content rate in oligothiophene, and total filling rate of particles in oligothiophene.

FIG. 13 is a comparative diagram, comparison among kinds of inorganic semiconductive material and inorganic conductive material, each particle diameter and total filling rate of a semiconductor layer of third embodiment, and average value of carrier mobility and cutoff frequency of TFT with regard to the semiconductor layer of the third embodiment, and the TFT of the first embodiment.

DETAILED DESCRIPTION OF PREFERRED EMBODIMENTS

Embodiments of the present invention will be explained with reference to the drawings.

First Embodiment

In the first embodiment of the present invention, TFT comprises a semiconductor layer made of organic semiconductive material which contains inorganic semiconductive material particles therein. Typical configurations, manufacturing methods, evaluation results and others will be explained.

FIG. 1 is a sectional view schematically showing typical first configuration of TFT.

Figure 1A:
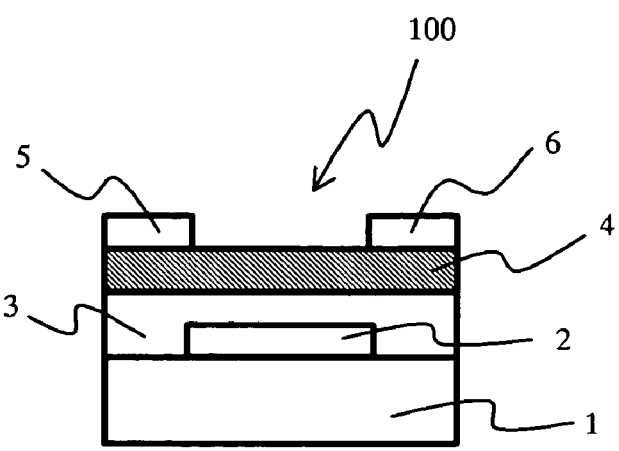
FIGS. 1A to 1D are sectional views schematically showing first configurations of TFT.
Figure 1B:
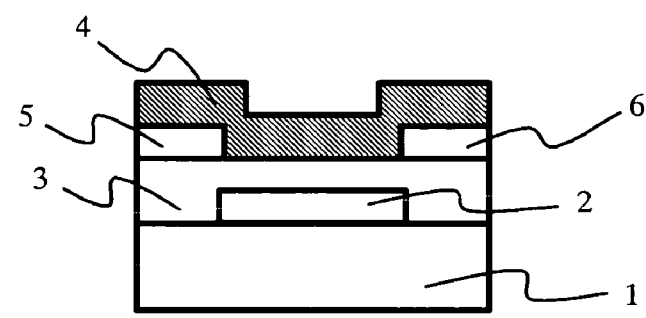
Figure 1C:
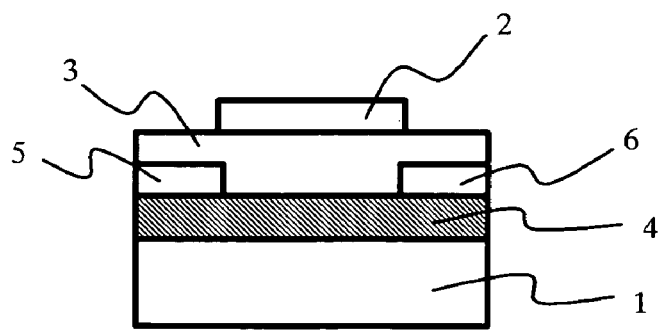
Figure 1D:
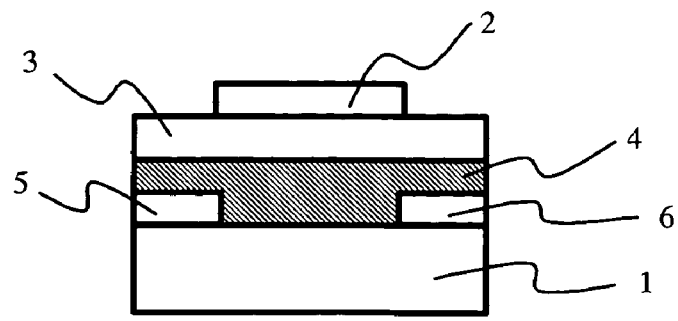

As shown in FIGS. 1A to 1D, a variety of configurations of TFT 100 of the present embodiment are considered. In any configuration, it is common that a substrate 1, a gate electrode 2, a gate insulating layer 3, a semiconductor layer 4, a source electrode 5, and a drain electrode 6 are comprised as constitution elements. Here, FIGS. 1A and 1B are called "bottom-gate method". FIGS. 1C and 1D are called "top-gate method". Further, FIGS. 1A and 1C are also called "top-contact method" and FIGS. 1B and 1D are also called "bottom-contact method", depending on positional relation between the semiconductor layer 4, the source electrode 5 and the drain electrode 6. TFT 100 shown in FIGS. 1A through 1D is called "horizontal-type TFT" because the source electrode 5 and the drain electrode 6 are arranged so as to be horizontally opposite to each other in a cross section.

In addition to the conventional horizontal-type TFT shown in FIGS. 1A through 1D, recently proposed is the vertical-type TFT wherein the source electrode 5 and the drain electrode 6 are arranged so as to be vertically opposite to each other in the cross section.

Figure 2A:
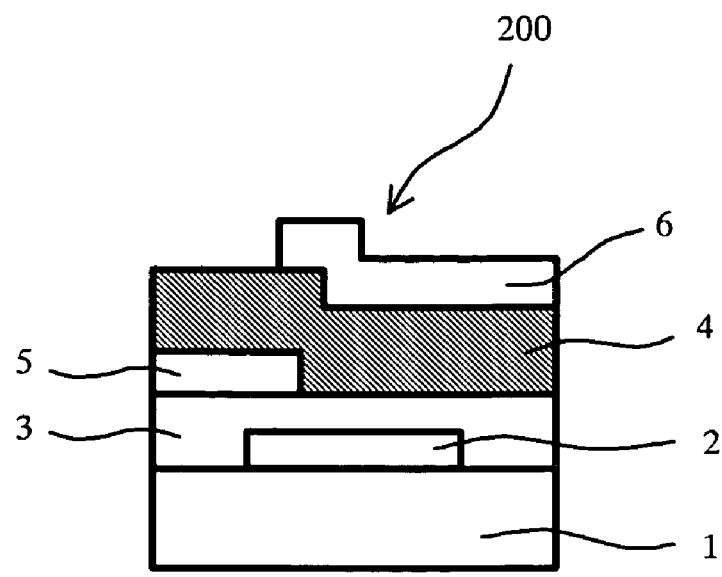
FIGS. 2A and 2B are sectional views schematically showing second configurations of TFT.
Figure 2B:
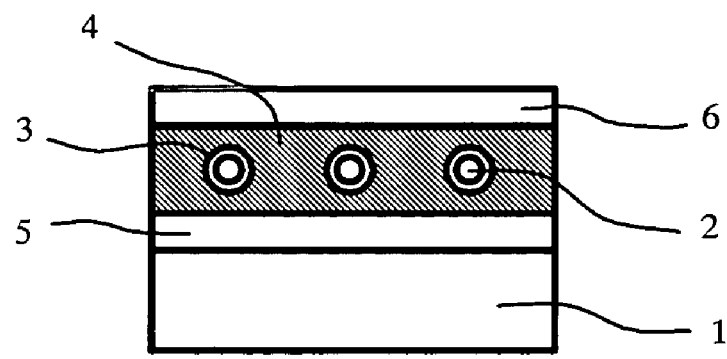

FIGS. 2A and 2B are sectional views schematically showing the second example of the typical TFT.

As shown in FIGS. 2A and 2B, TFT 200 of the present embodiment is also basically same with TFT 100 shown in FIGS. 1A to 1D, in terms of constitution element such as substrate 1, gate electrode 2, gate insulating layer 3, semiconductor layer 4, source electrode 5 and drain electrode 6. However, in TFT 200 of the present embodiment in FIGS. 2A and 2B, the source electrode 5 and the drain electrode 6 are disposed to sandwich the semiconductor layer 4 to be opposite to each other in film thickness direction (in vertical direction). For this reason, TFT 200 is called vertical-type TFT.

Because the effect of the present invention is obtained by the function of the material constitution of the semiconductor layer, either FIG. 1 or 2 may be used with regard to TFT construction itself, that is, the configuration is not restricted. Therefore, the construction of top-gate method TFT 100 shown in FIG. 1C is explained as an example.

As shown in FIG. 1C, TFT 100 employing a top-gate method comprises a substrate 1, a semiconductor layer 4 made of π-conjugated system organic semiconductor molecule, a source electrode 5, a drain electrode 6, a gate insulating layer 3, and a gate electrode 2. More particularly, the semiconductor layer 4 is provided on the main surface of the substrate 1, and the source electrode 5 and the drain electrode 6 are provided on the semiconductor layer 4 so as to be separated from each other. The gate insulating layer 3 is arranged so as to cover the source electrode 5, the drain electrode 6, and an exposed surface of the semiconductor layer 4. The gate electrode 2 is provided on the gate insulating layer 3 in a position at least between the source electrode 5 and the drain electrode 6 in a plane view. That is, in the top-gate method TFT 100 shown in FIG. 1C, the semiconductor layer 4, the source electrode 5, the drain electrode 6, and the gate insulating layer 3 are laminated on the substrate 1, and the gate electrode 2 is arranged on the gate insulating layer 3.

In TFT 100 shown in FIG. 1C, the substrate 1 is polyethylene plastic substrate. Organic semiconductive material of the semiconductor layer 4 is oligothiophene derivative molecule (hereinafter simply referred to as oligothiophene) which is one of π-conjugated system organic semiconductor molecules. And in this semiconductor layer 4, inorganic semiconductive material dispersed inside the organic semiconductive material is P-type silicon crystal particle, which has lower electric resistance than that of organic semiconductive material during ON operating time of TFT. A particle diameter of this P-type silicon crystal particle is smaller than a distance between the source electrode 5 and the drain electrode 6. Material of the source electrode 5, the drain electrode 6, and the gate electrode 2 is electrode material including PEDOT (poly 3,4-ethylene deoxythiophene) as primary component. Material of the gate insulating layer 3 is polyvinylphenole.

When manufacturing TFT 100 of the above configuration, first, P-type silicon crystal particles to be dispersed inside the organic semiconductive material are selected by each particle diameter so as to be within the predetermined particle distribution. Then, when forming the semiconductor layer 4, the P-type silicon crystal particles are added to the solution melted with oligothiophene until desired filling quantity is satisfied. After the P-type silicon crystal particles are added to the oligothiophene solution, the mixture is stirred fully to inhibit aggregation of the P-type silicon crystal particles inside the organic semiconductive material and unevenness in its density distribution. The dispersion state of P-type silicon crystal particle in the solution melted with oligothiophene is checked, for example, with eyes or optical microscope. Thereby it makes the dispersion state of P-type silicon crystal particles desired during the formation of semiconductor layer 4. When P-type silicon crystal particles are aggregated or become uneven in the solution melted with oligothiophene, the mixture is stirred more sufficiently.

Next, the material thus prepared for forming the semiconductor layer 4 is coated on the plastic substrate 1 by spin coating method. Then the substrate 1 coated with the semiconductor layer formation material is fully dried to form the semiconductor layer 4 made of the semiconductor layer formation material on the substrate 1.

Next, predetermined electrode material is printed using screen plate which was preliminarily patterned to get desired form, and then it is fully dried to form the source electrode 5 and the drain electrode 6 on the semiconductor layer 4 made of semiconductor layer formation material. Thereby, the source electrode 5 and the drain electrode 6 having desired forms are formed on the semiconductor layer 4.

Then, predetermined insulation material is printed on the source electrode 5, the drain electrode 6 and the semiconductor layer 4 using the preliminarily patterned screen plate and fully dried to form a gate insulating layer 3. Thereby, the gate insulating layer 3 having desired forms is formed on the semiconductor layer 4, the source electrode 5, and the drain electrode 6.

Finally, as above mentioned, predetermined electrode material is printed using the screen plate which was preliminarily patterned to get desired form and then fully dried to form a gate electrode 2 on the gate insulating layer 3. Thereby, the gate electrode 2 having desired forms is formed on the gate insulating layer 3.

Thus, in TFT 100, the semiconductor layer 4, the source electrode 5, the drain electrode 6, the gate insulating layer 3, and the gate electrode 2 are each printed on the substrate 1 by the printing method using screen plate and then they are fully dried.

In this embodiment, a semiconductor property evaluation sample provided with plurality of TFT 100 is used to evaluate semiconductor property (cutoff frequency, carrier mobility, etc).

Figure 3:
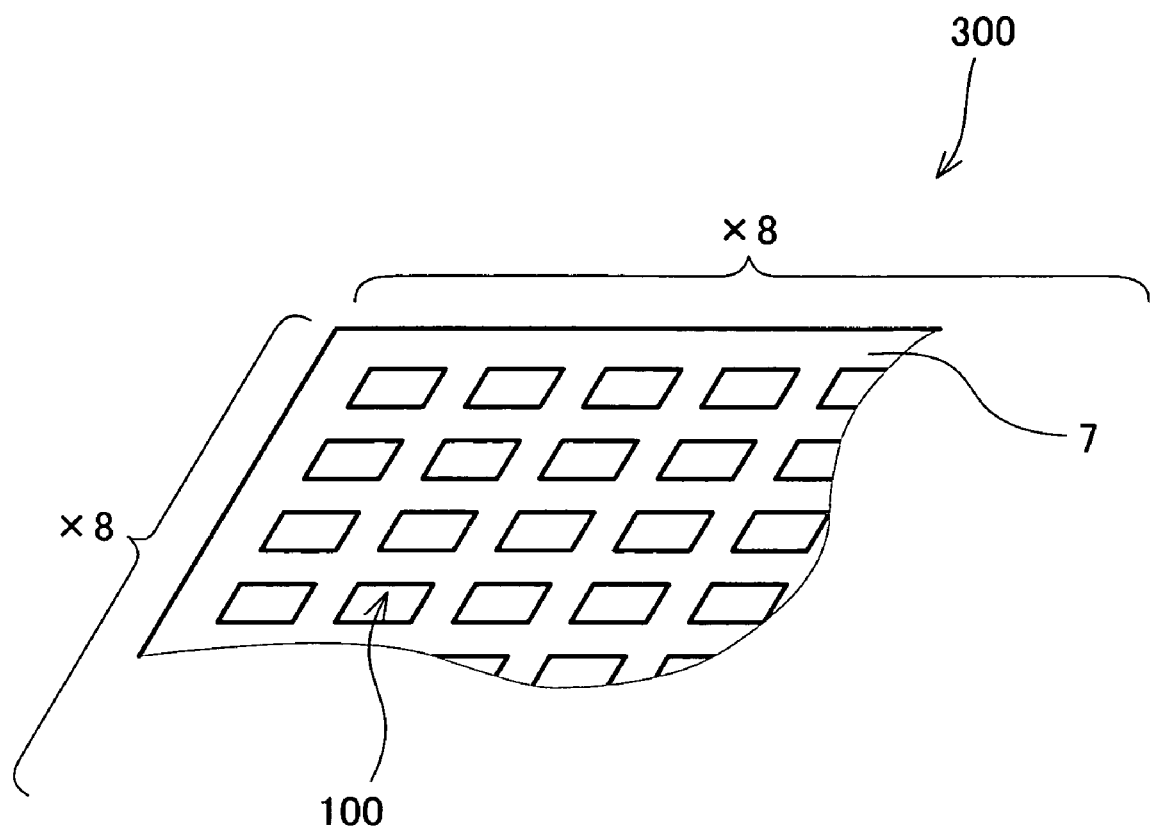
FIG. 3 is a perspective view schematically showing semiconductor property evaluation samples according to the first embodiment.

FIG. 3 is a perspective view schematically showing a semiconductor property evaluation sample of the first embodiment. FIG. 3 shows an excerpt of a part of the sample and a parallelogram represents TFF.

As shown in FIG. 3, a semiconductor property evaluation sample 300 has TFT 100s which has a cross sectional structure as in FIG. 1C. And TFT 100s are arranged in a state of matrix of 8×8 on a sheet of plastic substrate 7. In this embodiment, the size of the plastic substrate 7 is 70 mm×70 mm. The semiconductor property evaluation sample 300 is provided with a proving pad portion so as to electrically contact with each electrode of each TFT 100 from above the plastic substrate 7. In each TFT 100, a distance between the source electrode and the drain electrode (channel length) is 100 μm each.

In this embodiment, to measure the average particle diameter of the inorganic semiconductive material particles dispersed inside the organic semiconductive material, an average particle diameter measurement method using image recognition is employed.

Figure 4A:
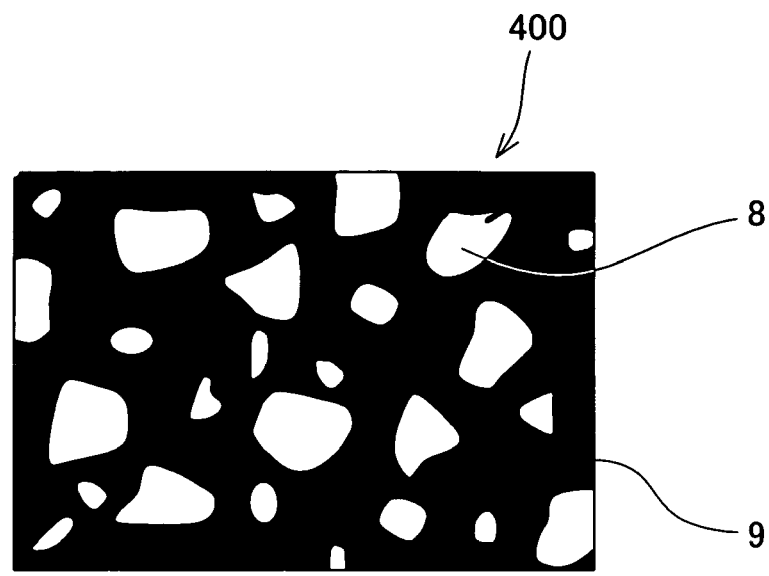
FIG. 4A is a sectional view schematically showing a part of semiconductor layer of TFT.

FIG. 4A is a sectional view schematically showing a part of semiconductor layer of TFT. It is easy to check the state where the inorganic semiconductive material particles 8 are dispersed inside the organic semiconductive material 9 by observing a sectional surface 400 of a part of said semiconductor layer as shown in FIG. 4A. The inorganic semiconductive material particles 8 have various particle diameters.

It is possible to recognize difference between inorganic semiconductive material particles 8 and organic semiconductive material 9 based on difference in color tone (or contrasting density), as shown in FIG. 4A, by observing the sectional surface 400 of the semiconductor layer 4 constituting TFT 100 with observing means such as optical microscope and electronic microscope. For example, the inorganic semiconductor material particles 8 are recognizable as white color body while the organic semiconductive material 9 as black color body in FIG. 4A. In this case, it is not necessarily observed that the inorganic semiconductive material particles 8 are white and the organic semiconductive material 9 is black as in FIG. 4A. However, difference in color tone (or color density) between material kinds appears in the observed image. Therefore, it is possible to make difference between the inorganic semiconductive material particles 8 and the organic semiconductive material 9 by adjusting threshold for binalization by image processing. And, when difference between the inorganic semiconductive material particle 8 and the organic semiconductive material 9 is recognized with above-mentioned observation means, area of the inorganic semiconductive material particle 8 is computed with predetermined image recognition software and data processing device, and then particle diameter of the inorganic semiconductive material particle 8 is computed based on the computed area. In the date processing device, the computed particle diameter of each inorganic semiconductive material particle 8 is accumulated, and the particle diameter distribution of the inorganic semiconductive material particles 8 dispersed inside the organic semiconductive material 9 is obtained.

Figure 4B:
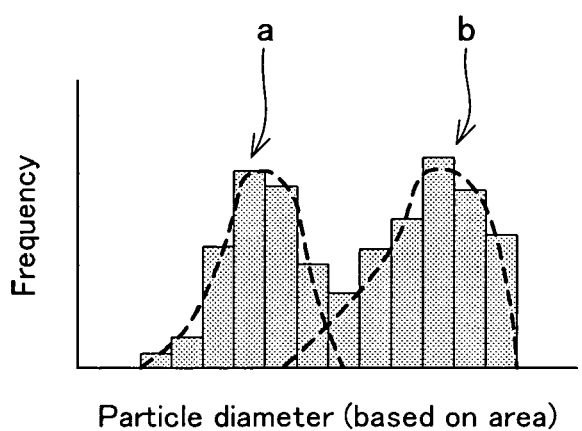
FIG. 4B is a distribution chart schematically showing distribution of particle diameter of inorganic semiconductive material, which is derived by image recognition.

FIG. 4B is a distribution chart schematically showing distribution of particle diameter of inorganic semiconductive material particles, which is derived by the image recognition. In FIG. 4B, the horizontal axis represents particle diameter of the inorganic semiconductive material particle 8 which is obtained by the image recognition means and the vertical axis represents frequency.

As illustrated in FIG. 4B, average particle diameter of the inorganic semiconductive material particles 8 dispersed inside the organic semiconductive material 9 is obtained based on the particle diameter distribution obtained by the image recognition. For example, in FIG. 4B, peak "a" shows average particle diameter of the first particle group related to the inorganic semiconductive material particles 8, and peak "b" shows average particle diameter of the second particle group related to the inorganic semiconductive material particle 8. These peaks "a" and "b" can be automatically separated and average particle diameters of the particle groups can be automatically computed by the image recognition software.

In this embodiment, the average particle diameter of the inorganic semiconductive material particle 8 dispersed inside the organic semiconductive material 9 is obtained using the image recognition means shown in this embodiment. The method of calculating the average particle diameter using the image recognition means shown in this embodiment is one example of various calculation methods of average particle diameter. Therefore, the calculation method of average particle diameter is not limited to the use of the above mentioned image recognition means, and any means may be used.

FIG. 5 is a combination diagram showing particle kinds of P-type silicon crystal (kinds of average particle diameter herein) used in the first embodiment, individual particle content rate (volume %) in oligothiophene, and total filling rate (volume %) of entire particles in oligothiophene. In this embodiment, used as P-type silicon crystal particle are the first particle having average particle diameter of 20 μm (P-type silicon crystal 1) and the second particle having average particle diameter of 1.5 μm (P-type silicon crystal 2).

As shown in FIG. 5, in this embodiment, up to total filling rate of 40 volume %, the semiconductor layer material is made of only a single kind of the first particle having average particle diameter of 20 μm. With total filling rate of 40 volume % or more, the second particle of average particle diameter of 1.5 μm is added to produce the semiconductor layer material. The reason is that some measures such as additional pressing process after film formation of the semiconductor layer is needed to exceed a certain filling rate with a single particle diameter and such additional process is prevented.

Now, with regard to average particle diameter of the P-type silicon crystal, a ground of setting of the above-mentioned second particle diameter will be explained.

Figure 6:
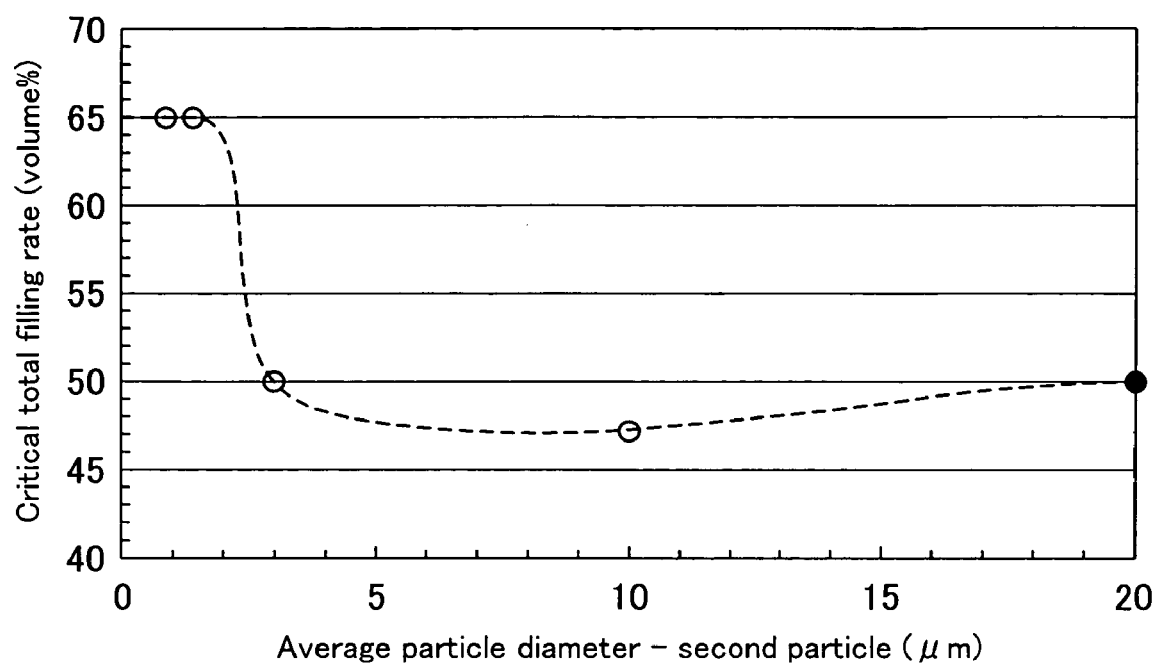
FIG. 6 is a graph relating average particle diameter to critical total filling rate of the second particle.

FIG. 6 is a graph relating average particle diameter to critical total filling rate of the second particle. In FIG. 6, the horizontal axis represents the average particle diameter (μm) of the second particle and the vertical axis represents critical total filling rate (volume %).

In this embodiment, regarding the semiconductor layer material wherein a content rate of the first particle (average particle diameter: 20 μm) is 40 volume %, the average particle diameter of the second particle is varied and added. The critical total filling rate is checked and the average particle diameter of the second particle is set according to the rate. In particular, FIG. 6 shows that the total filling rate exceeds the critical total filling rate (black circle in FIG. 6) when the average particle diameter of the second particle is less than 3 μm (i.e. 15% of the first particle diameter). On the other hand, FIG. 6 shows that the total filling rate falls below the critical total filling rate when the second particle diameter exceeds 15% of the first particle diameter. That means, when no additional process such as pressing process after film formation is performed, it is possible to easily raise the filling rate of particles of P-type silicon crystal by mixing the second particle whose diameter is smaller than the first particle diameter. This embodiment sets the second particle diameter more than 0% and less than 15% of the first particle diameter, based on the examination result. In particular, it sets the second particle diameter at 1.5 µm.

Now, the evaluation result with regard to the semiconductor property of TFT in this embodiment will be explained.

Figure 7:
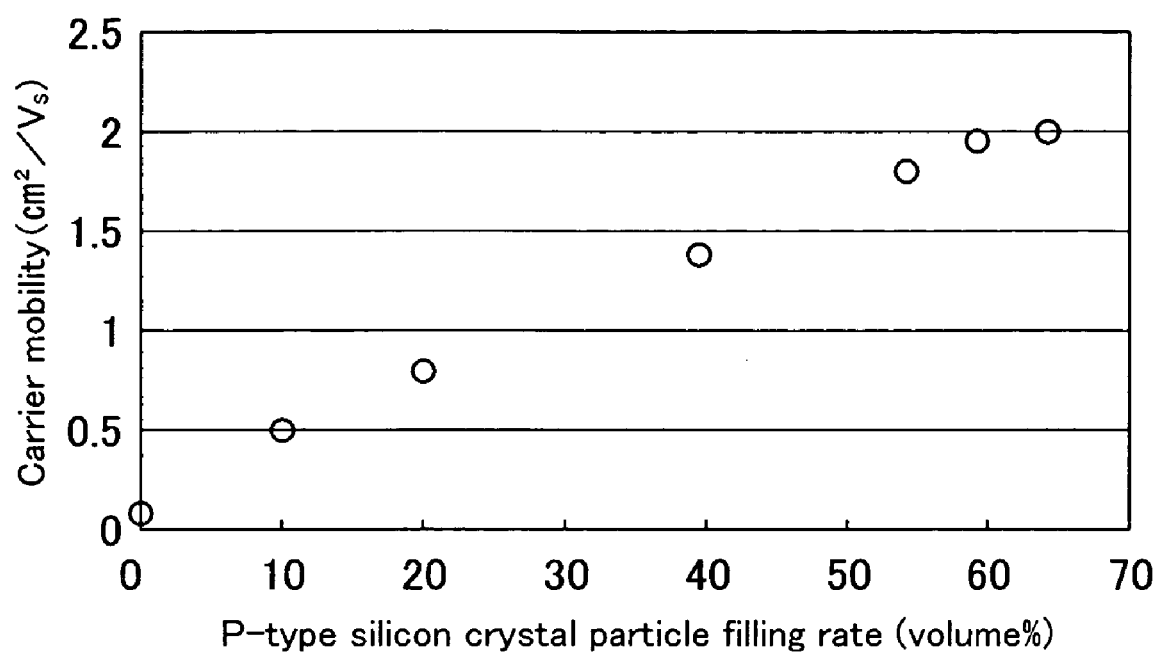
FIG. 7 is a graph relating particle filling rate of P-type silicon crystal to carrier mobility of TFT.

FIG. 7 is a graph relating particle filling rate of P-type silicon crystal to carrier mobility of TFT. In FIG. 7, the horizontal axis represents the total filling rate (volume %) of P-type silicon crystal particle and the vertical axis represents the average value of carrier mobility ($cm^2/Vs$) of TFT.

As shown in FIG. 7, TFT is produced using various semiconductor layer materials having different filling rate of P-type silicon crystal particle shown in FIG. 5 and this TFT is used to evaluate the carrier mobility. The result shows that as the filling rate of P-type silicon crystal particle increases, the carrier mobility of TFT increases.

Next, the result of evaluation with regard to bending reliability of the produced TFT will be explained.

Figure 8:
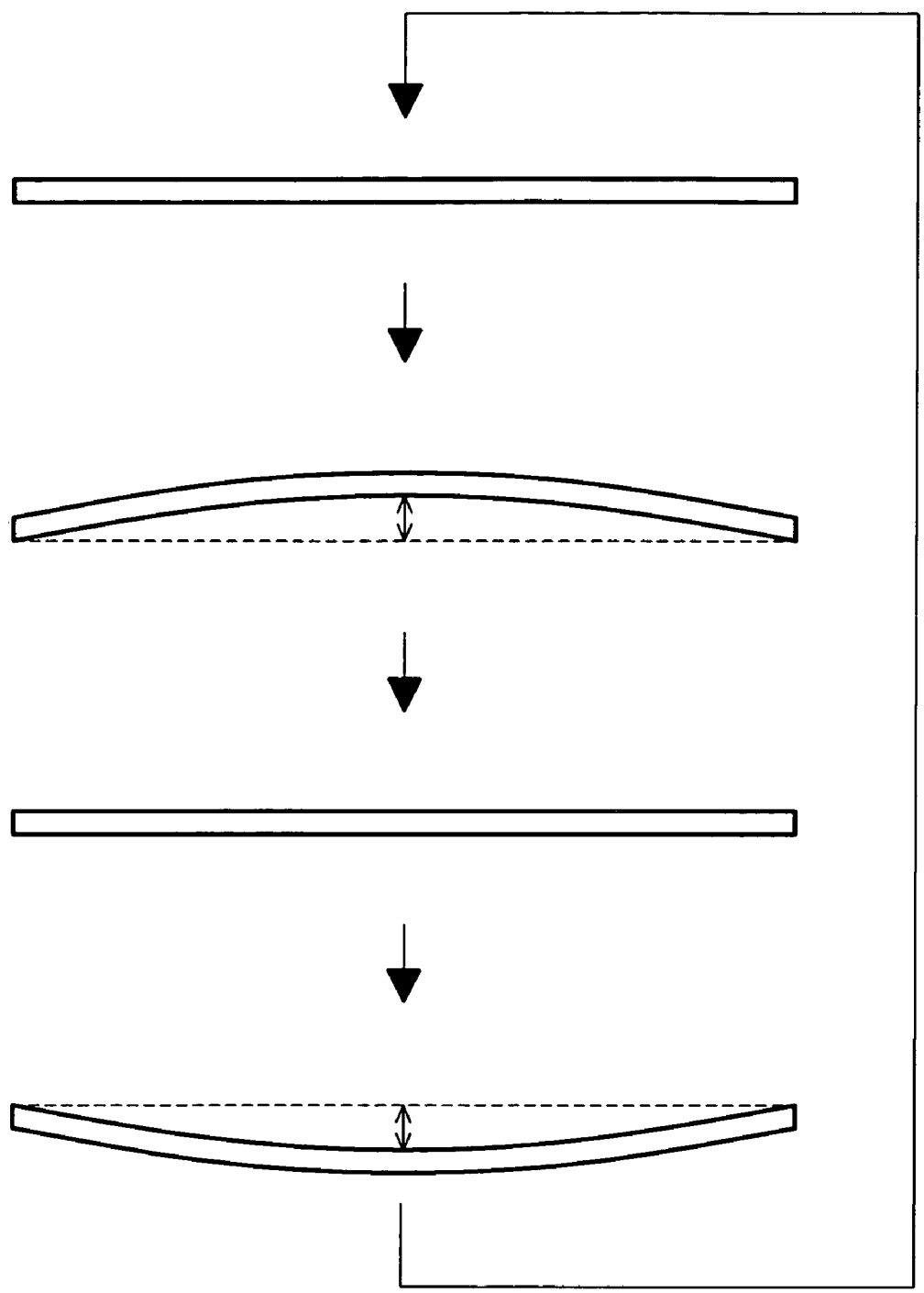
FIG. 8 is a configuration view schematically showing a bending resistance evaluation according to the first embodiment.

FIG. 8 is a configuration view schematically showing a bending resistance evaluation relating to the first embodiment.

This bending resistance evaluation uses a semiconductor property evaluation sample 300 wherein TFT 100 is formed in the state of matrix 8×8 on the plastic substrate 7 as shown in FIG. 3. This sample 300 is deformed upward and downward by 5 mm at a cycle and the reliability test of 10 cycles is performed. When even one out of the entire 64 elements of TFT 100 does not work on the semiconductor property evaluation sample 300, it is determined as defective flexibility. In this bending resistance evaluation, defective rate of TFT is calculated using 10 sheets of samples which are prepared per each filling amount of P-type silicon crystal particle.

Figure 9:
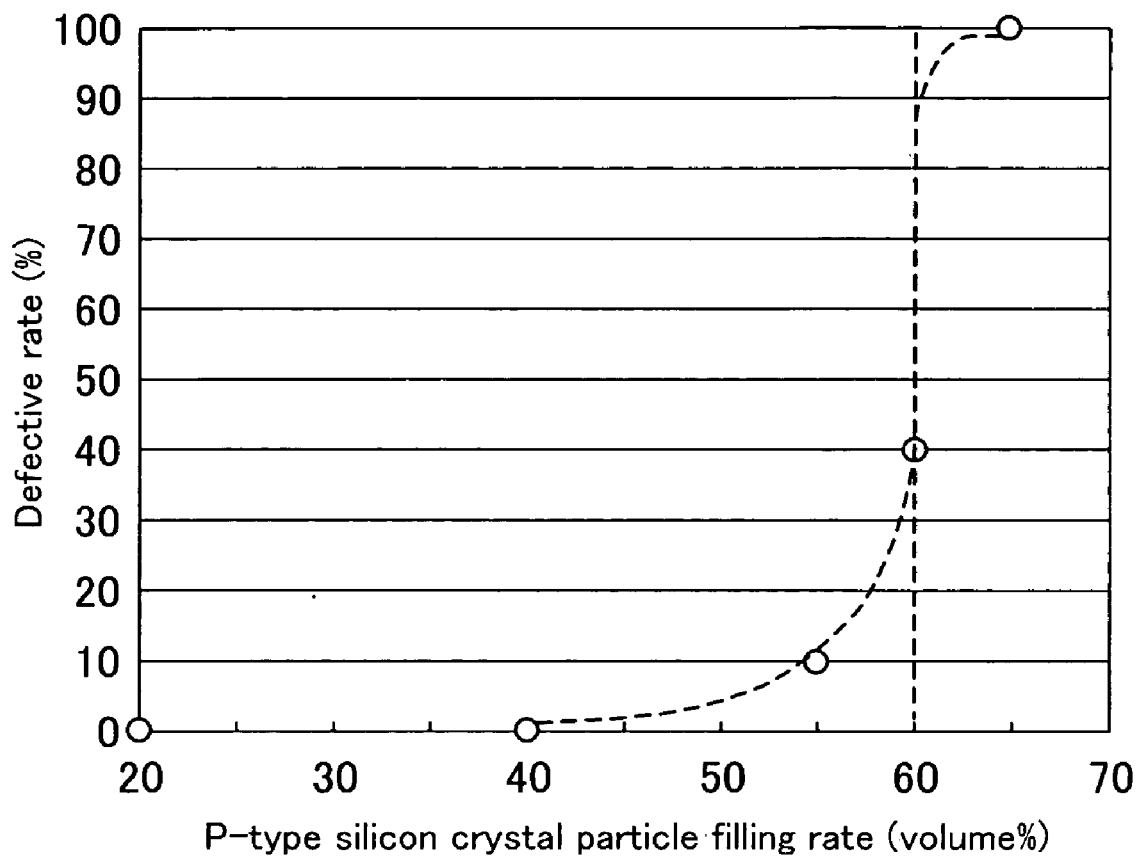
FIG. 9 is a graph relating particle filling rate to defective rate of P-type silicon crystal.

FIG. 9 is a graph relating particle filling rate to defective rate of P-type silicon crystal. In FIG. 9, the horizontal axis represents total filling rate (volume %) of the P-type silicon crystal particle and the vertical axis represents defective rate (%) of TFT.

FIG. 9 shows that when the filling rate of P-type silicon crystal particle is low, few defectives occur in TFT and defective of 40% occur at the filling rate of 60 volume %. All samples are found to be defective at the filling rate of 65 volume % through bending test. This is because elasticity of the semiconductor layer is getting lost, as the particle filling rate of P-type silicon crystal as inorganic semiconductive material increases. This evaluation result shows that content rate of the inorganic semiconductive material particle in the semiconductor layer is desired to be more than 0 volume % and not more than 60 volume %.

In this embodiment, oligothiophene is used as organic semiconductive material and P-type silicon crystal particle is used as inorganic semiconductive material to be dispersed inside the organic semiconductive material. However, effect of the present invention is also provided by other materials. For example, acene based organic semiconductive material such as pentacene, tetracene, oligoacene, etc. and partially substituted or chemically modified derivative from these structures may be used as organic semiconductive material. And the same effect as that of the present invention can be obtained using not only derivative from thiophene based polymer, acene based polymer, but also derivatives from acetylene based, pyrrohl based, or phenylene based polymer may be used. Further, the same effect as that of the present invention can be obtained using derivative from copolymer which is combination of any one of said materials. And the same effect as that of the present invention can be obtained using semiconductors such as germanium and intermetallic compound may be used as the inorganic semiconductive materials.

As for particle diameter of the inorganic semiconductive material to be dispersed inside the organic semiconductive material, particle diameter is not limited to those shown FIG. 5. That means, the same effect as that of the present invention can be obtained as long as the material combination is based on the present invention concept that the inorganic semiconductive material particles having low electric resistance are dispersed inside the organic semiconductive material having high elasticity.

Although PEDOT-based electrode material is used as electrode material of the source electrode, the drain electrode and the gate electrode respectively in this embodiment, the other conductive polymer materials may be used. And, inorganic material such as ITO, Au, or Cu may be used. However, it is desirable to select elastic material in order to form mechanically flexible and impact-resistant TFT, or to select electrode configurations which are less susceptible to bending. Although materials of the gate insulating layer and the substrate are not limited to those used in this embodiment, it is desirable to select elastic material, or to use materials which are less susceptible to bending as in the electrodes.

As mentioned above, each material element of the organic semiconductive material and the inorganic semiconductive material is not necessarily single material but mixture of 2 or more kinds of materials may be used (the inorganic semiconductive materials may be individually dispersed or dispersed as mixed particles inside the organic semiconductive material). It is easily assumed that the same effect as the present invention can be obtained from such configurations.

Second Embodiment

In second embodiment of the present invention, TFT comprises a semiconductor layer made of organic semiconductive material which contains a plurality of inorganic conductive material particles therein. The typical configuration, manufacturing method, and evaluation result and others will be explained.

In this embodiment, the configuration of TFT itself is the same as that of the first embodiment shown in FIG. 1C. Polyethylene plastic substrate is used as material of substrate 1. Substituted oligothiophene is used as an organic semiconductive material of semiconductor layer 4 and particulate Cu is used as inorganic conductive material to be dispersed inside the semiconductor layer. The PEDOT-based electrode material is used as material of a source electrode 5, a drain electrode 6 and a gate electrode 2. And polyvinyl phenol is used as material of a gate insulating layer 3.

A method of manufacturing TFT of this embodiment is basically the same as that of the first embodiment. The manufacturing method will be outlined. First, Cu particles to be dispersed inside the organic semiconductive material are selected so as to fall within a certain particle size distribution per desired particle diameter. Then, Cu particles are added to solution melted with substituted oligothiophene to desired filling amount in forming semiconductor layer. In this case, the solution containing substituted oligothiophene and Cu particle are fully mixed to inhibit aggregation of the Cu particles and uneven density distribution. This makes the Cu particle dispersion condition good when the semiconductor layer 4 is formed. And material forming the semiconductor layer is coated on the plastic substrate 1 by a spin coating method and dried to form the semiconductor layer 4. Finally the source electrode 5, the drain electrode 6, and the gate electrode 2 are formed into the desired configuration by screen printing and fully dried.

As in the first embodiment, the second embodiment uses a semiconductor property evaluation sample 300 wherein TFT 100 is formed in a matrix state of 8×8 on the plastic substrate 7 of 70 mm×70 mm, when evaluating TFT semiconductor property. A method of dispersing Cu particles inside the organic semiconductive material is the same as that of the P-type silicon crystal particles of the first embodiment shown in FIG. 5. As shown in FIG. 10, in the case of high total filling rate of Cu particles, two kinds of particles—the first particles (Cu particle 1; average particle diameter 10 µm) and the second particles (Cu particle 2; average particle diameter 1 µm), are mixed.

Now the evaluation result with regard to semiconductor property of TFT in the present embodiment will be explained.

Figure 11:
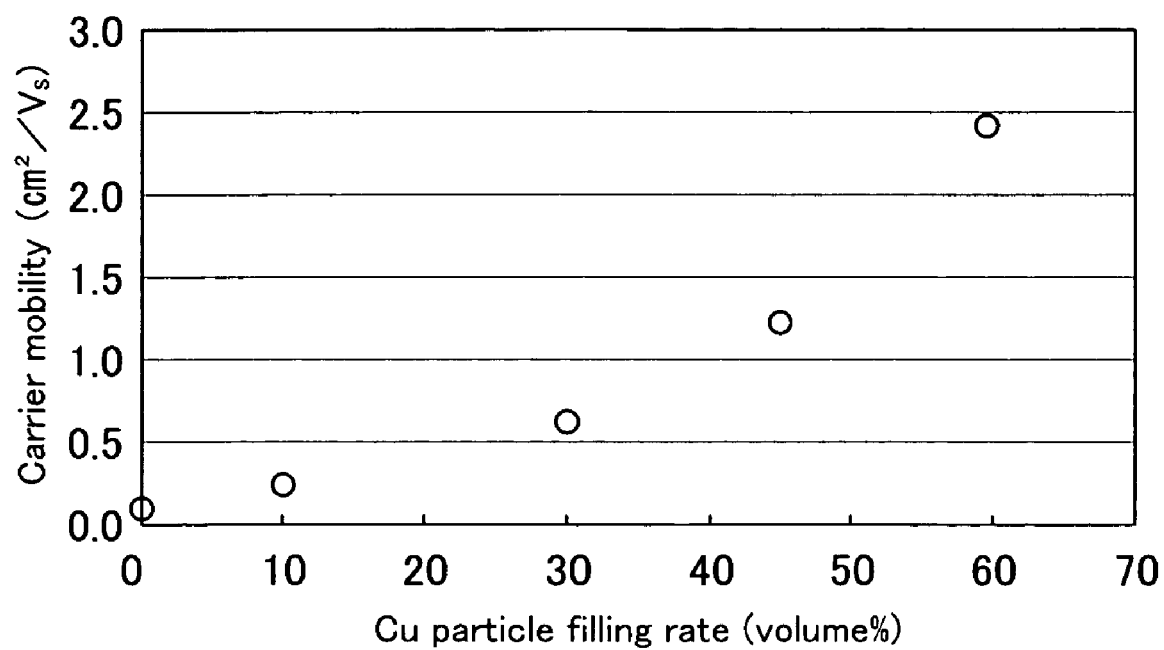
FIG. 11 is a graph relating total filling rate of Cu particle to carrier mobility of TFT.

FIG. 11 is a graph relating total filling rate of Cu particles to carrier mobility of TFT. In FIG. 11, the horizontal axis represents total filling rate (volume %) of the Cu particle and the vertical axis represents average value of the carrier mobility ($cm^2/Vs$) of TFT.

As shown in FIG. 11, TFTs are created using various semiconductor layer materials having different total filling rates of Cu particles as shown in FIG. 10. The carrier mobility is evaluated with this TFT. The result shows that as the filling rate of Cu particle increases, the carrier mobility of TFT increases. In FIG. 11, with regard to the sample having the Cu particle total filling rate of 60 volume %, more than half of the samples wherein semiconductor property is unable to be determined because of short circuit between the source electrode and the drain electrode. Therefore, an average value is shown based on only TFTs whose carrier mobility were able to be determined. Although not shown in FIG. 10, when Cu particle total filling rate exceeds 60 volume %, the short circuit occurred in all TFTs and it was impossible to determine the semiconductor property. Thus, it is found that as the total filling rate of Cu particle increases inside the organic semiconductive material, the carrier mobility of TFT increases.

Figure 12:
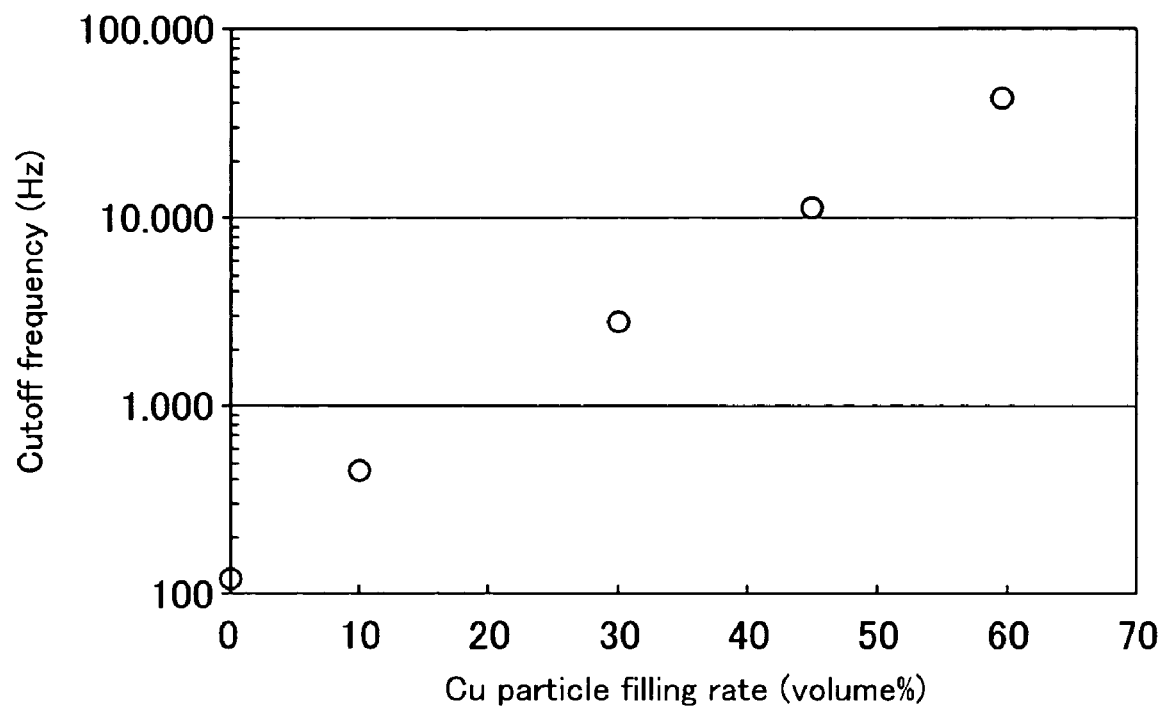
FIG. 12 is a graph relating total filling rate of Cu particle to cutoff frequency of TFT.

FIG. 12 is a graph relating total filling rate of Cu particle and cutoff frequency of TFT (gain is 1). In FIG. 12, the horizontal axis represents the total filling rate (volume %) of Cu particle and the vertical axis represents an average value of the cutoff frequency (Hz).

FIG. 12 shows that as the total filling rate of Cu particle inside the organic semiconductive material increases, the cutoff frequency of TFT increases. That means, addition of Cu particle to the semiconductor layer is found to be effective for improving the cutoff frequency of TFT using the organic semiconducive material.

In this embodiment, substituted oligothiophene is used as organic semiconductive material and Cu particle is used as inorganic conductive material to be dispersed. However, the effect of the present invention is also provided by other materials. And the diameter of Cu particle to be dispersed is not limited to the particle diameter shown in FIG. 10. That means, the same effect of the present invention is obtained as long as combination of materials is based on the concept of the present invention that the inorganic conductive material particle having low electric resistance is dispersed inside the organic semiconductive material having superior elasticity. In other respects, the second embodiment is the same as the first embodiment.

Third Embodiment

In third embodiment, TFT comprises a semiconductor layer made of organic semiconductive material which contains a plurality of inorganic semiconductive material particles and inorganic conductive material particles therein. In this embodiment, the sample configuration for evaluating semiconductor property, and manufacturing method of TFT are same as in the first embodiment and second embodiment. Therefore, explanation will be omitted. And material applied to each configuration element of TFT, except for semiconductor layer, is same as the first embodiment. For example, the organic semiconductive material which is based to form the semiconductor layer is oligothiophene as in the first embodiment.

Now, the evaluation result with regard to the semiconductor property of TFT in this embodiment will be explained.

FIG. 13 is a comparative diagram showing comparison among kinds of inorganic semiconductive material and inorganic conductive material, each particle diameter and total filling rate of a semiconductor layer of third embodiment, and average value of carrier mobility and cutoff frequency of TFT with regard to the semiconductor layer of the third embodiment, and the TFT of the first embodiment.

FIG. 13 shows that, with regard to carrier mobility and cutoff frequency, the configurations (1) and (2) of the third embodiment wherein Cu particle is dispersed together is better than the first embodiment wherein P-type silicon crystal particle alone is dispersed as inorganic semiconductive material particle inside the organic semiconductive material. That means, for improvement of carrier mobility and cutoff frequency of TFT using organic semiconductive material, it is found effective that two kinds of particles, namely P-type silicon crystal particle and Cu particle, are added to the semiconductor layer.

In this embodiment, oligothiophene is used as organic semiconductive material, P-type silicon crystal particle is dispersed as inorganic semiconductive material, and Cu particle is dispersed as inorganic conductive material. However, realization of the effect of present invention is provided by other materials. The diameter of particle to be dispersed is neither limited to the particle diameter shown in FIG. 13. That means, the same effect of the present invention is obtained as long as combination of materials is based on the concept of the present invention that the inorganic conductive material particle and inorganic semiconductive material particle which have low electric resistance are dispersed inside the organic semiconductive material having high elasticity. In other respects, the third embodiment is the same as the first and second embodiments.

Although a shape of inorganic material particle to be dispersed inside the organic semiconductive material is spherical in each of the first to third embodiments, realization of the effect of the present invention is provided by other configurations. Non-semispherical shape such as acicular particle and scale-like particle may be used to obtain similar effect. Or the combination of these particles may be used to obtain similar effect.

Although the spin coating method is used to form the semiconductor layer as a method of manufacturing TFT in the first to third embodiments, realization of the configuration of the present invention is provided by other means of forming the semiconductor layer. For example, process such as inkjet printing, submersion coating and screen printing may be used to form the similar semiconductor layer and obtain the similar effect.

Fourth Embodiment

In fourth embodiment of the present invention, sheet-like flexible display, radio ID tag, and portable devices such as cellular phone, communication terminal and portable medical device will be explained as examples of application of TFT described in the first to third embodiments.

First, an example of active matrix display using organic EL of the present embodiment in display portion as sheet-like flexible display will be explained.

Figure 14:
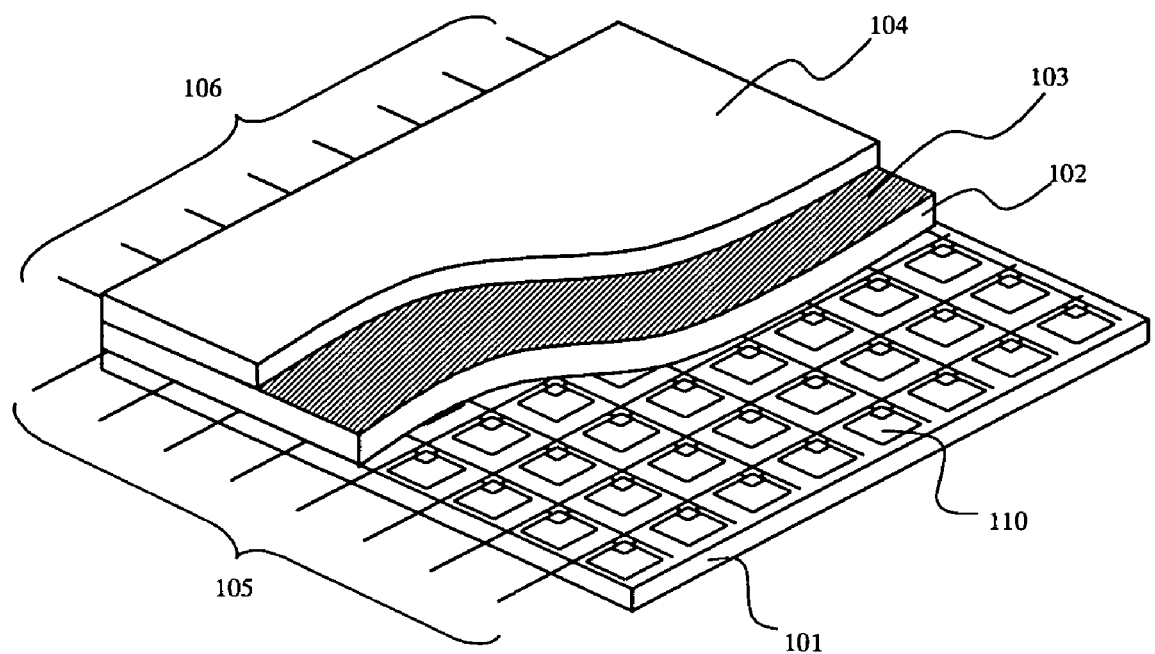
FIG. 14 is a perspective view schematically showing an active matrix display using organic EL in a display portion.

FIG. 14 is a perspective view schematically showing an active matrix display using organic EL in a display portion.

Figure 15:
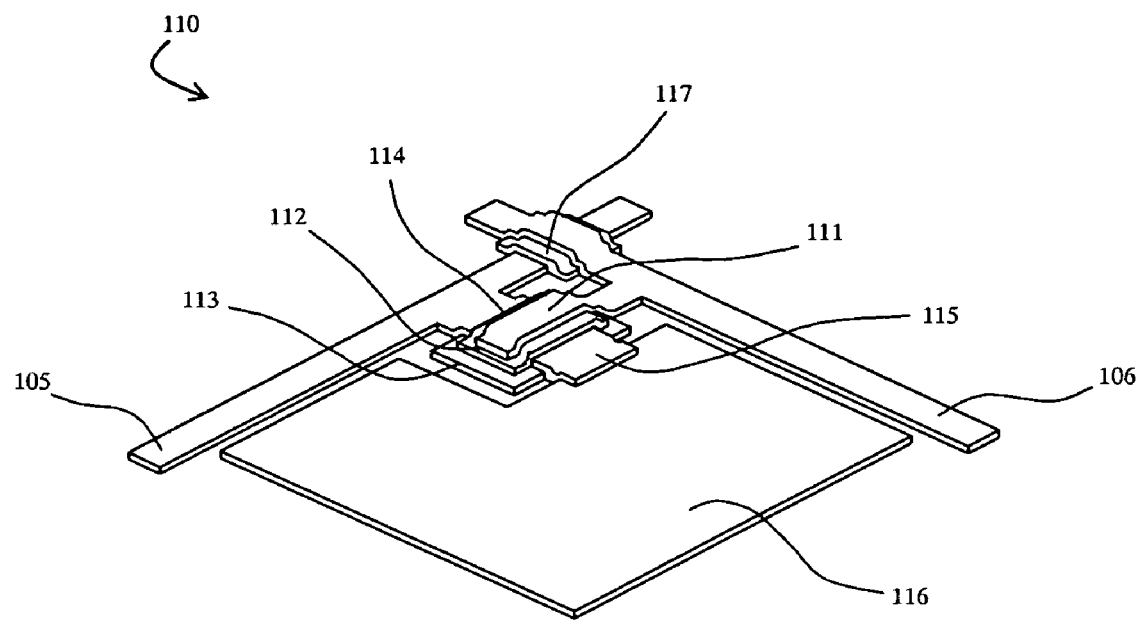
FIG. 15 is an enlarged view schematically showing a TFT drive circuit portion.

As shown in FIG. 14, in the active matrix display in this embodiment, TFT drive circuits 110 which are connected with pixel electrode are arrayed on a plastic substrate 101, and the TFT drive circuit 110 are provided with an organic EL layer 102 and a protective film 104 thereon. The organic EL layer 102 is provided with a transparent electrode 103 thereon. The organic EL layer 102 comprises an electronic transfer layer, a light-emitting layer, a hole transfer layer which are laminated each other. And source electrode lines 105 and gate electrode lines 106, which are extended from each predetermined electrode of TFT, are each connected with a control circuit which is not shown here. FIG. 15 shows an enlarged view of the TFT drive circuit 110. The lamination configuration of TFT itself is basically the same as the configuration shown in the first to third embodiments. That means, TFT shown in FIG. 15 comprises a semiconductor layer 113, a source electrode 114, a drain electrode 115, a gate insulating layer 112, a gate electrode 111 which are laminated. As shown in FIG. 15, the drain electrode 115 is electrically connected with the pixel electrode 116 of the organic EL. An insulating layer 117 is provided at an intersection of the gate electrode line 106 connected with the gate electrode 111 and the source electrode line 105 connected with the source electrode 114.

With the active matrix display comprising TFT explained in the first to third embodiments, it is possible to manufacture TFT portion by low-cost process and, therefore, to make the display as a whole inexpensive and to realize the sheet-like display having excellent mechanical flexibility and impact resistance. It is also possible to provide an active matrix display having high display speed (response speed).

Although the case in which the organic EL is used for the display portion has been described in this embodiment, the effect of this invention is provided by active matrix displays other than the active matrix display of the configuration. That means, the same effect can be achieved as long as the display is the active matrix display requiring TFT circuit.

And, the configuration of a drive circuit to drive pixel is not limited to the configuration of this embodiment. That means, for example, combination of TFT for driving current to drive a pixel and TFT for switching to control it may be used. And a circuit including more plurality of TFTs may be used.

Next, application of the TFT of the present invention to a radio ID tag will be explained.

Figure 16:
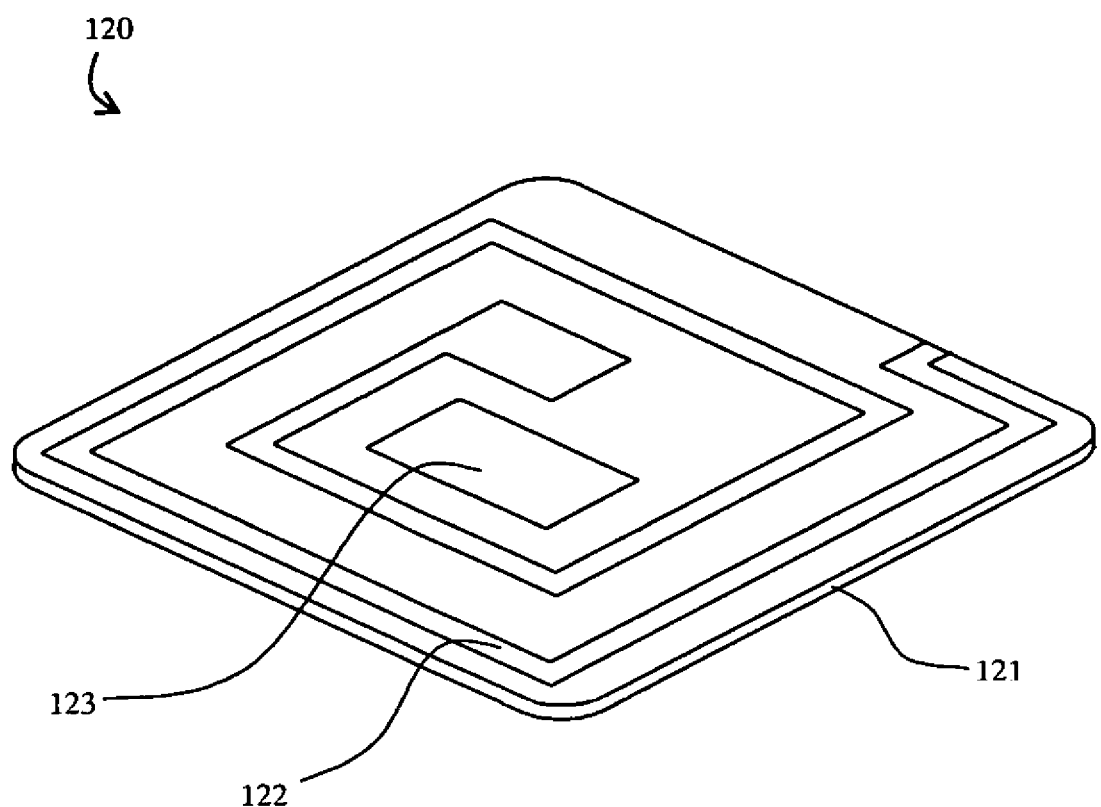
FIG. 16 is a perspective view schematically showing a radio ID tag using TFT of the present embodiment.

FIG. 16 is a perspective view schematically showing a radio ID tag using TFT of the present embodiment.

As shown in FIG. 16, a film plastic substrate 121 is used as a base of a radio ID tag 120. The substrate 121 is provided with an antenna portion 122 and a memory IC portion 123 thereon. The memory IC portion 123 may use TFT explained in the first to third embodiments. If the radio ID tag 20 has an adhesive rear surface, it is possible to attach on uneven surfaces of things such as snack bag and drink can. The surface of the radio ID tag 120 is provided with a protective film as necessary.

Thus, using the TFT of the first to third embodiments makes it possible to realize the radio ID tag which can be attach to surfaces having various shapes and materials. It also makes possible to provide the radio ID tag having high response speed (process speed).

The effect of the present invention is set as desired by configurations other than the configuration of radio ID tag shown in FIG. 16. Therefore, arrangement and configuration process of the antenna portion and the memory IC portion is optional. For example, an ethic circuit portion may be incorporated in the radio ID tag.

In the configuration of the present embodiment, it is explained that the antenna portion 122 and the memory IC portion 123 are previously formed on the plastic substrate 121. However, the present invention is not to limited to this configuration but process such as inkjet printing may be employed to form the radio ID tag directly on the subject. And, in this case, using the TFT configuration of the present invention, it is also possible to produce a high-performance radio ID tag having high mechanical flexibility and impact resistance at low cost.

Figure 17:
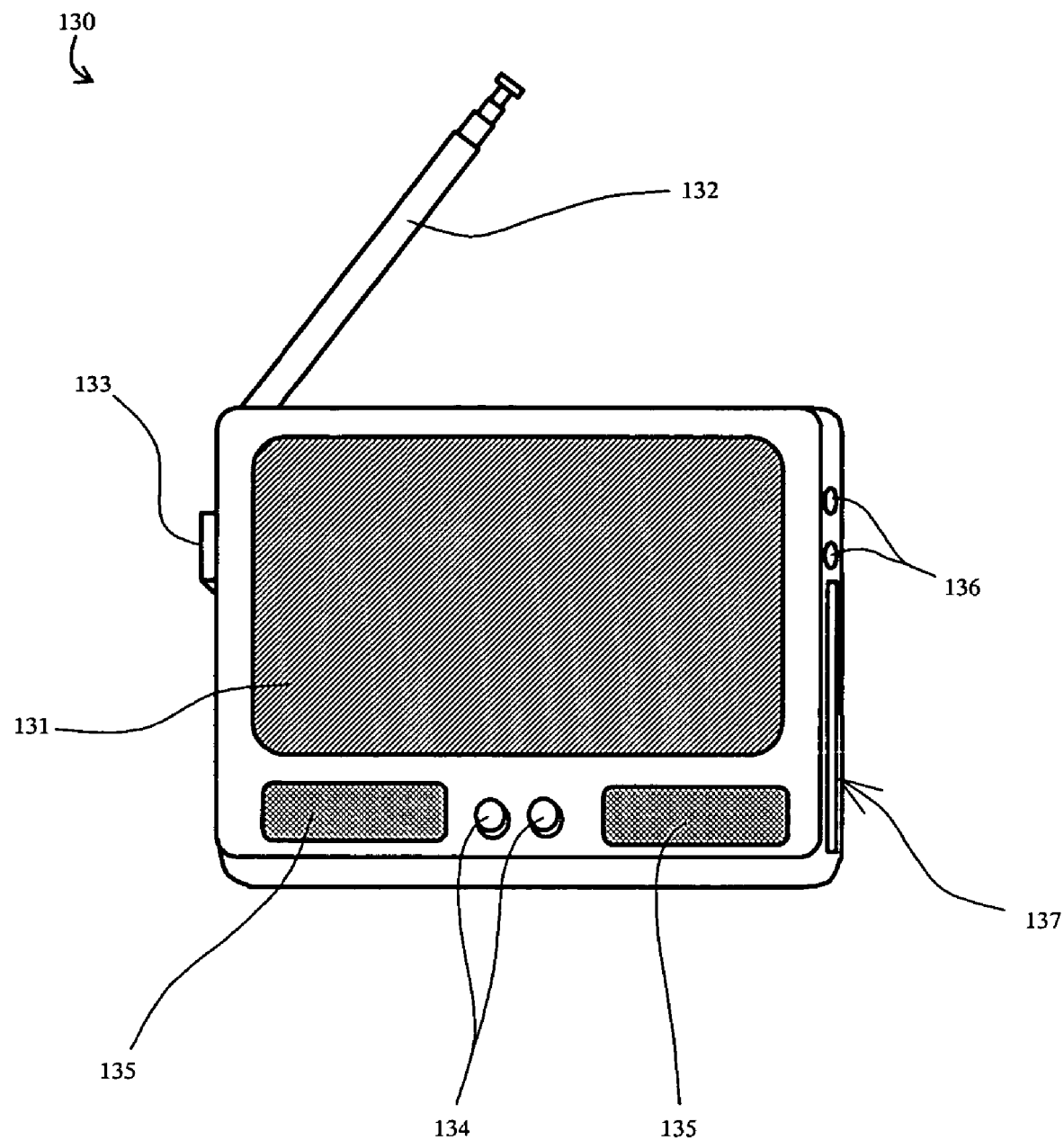
FIG. 17 is a front view schematically showing a portable TV using TFT of the present embodiment.
Figure 18:
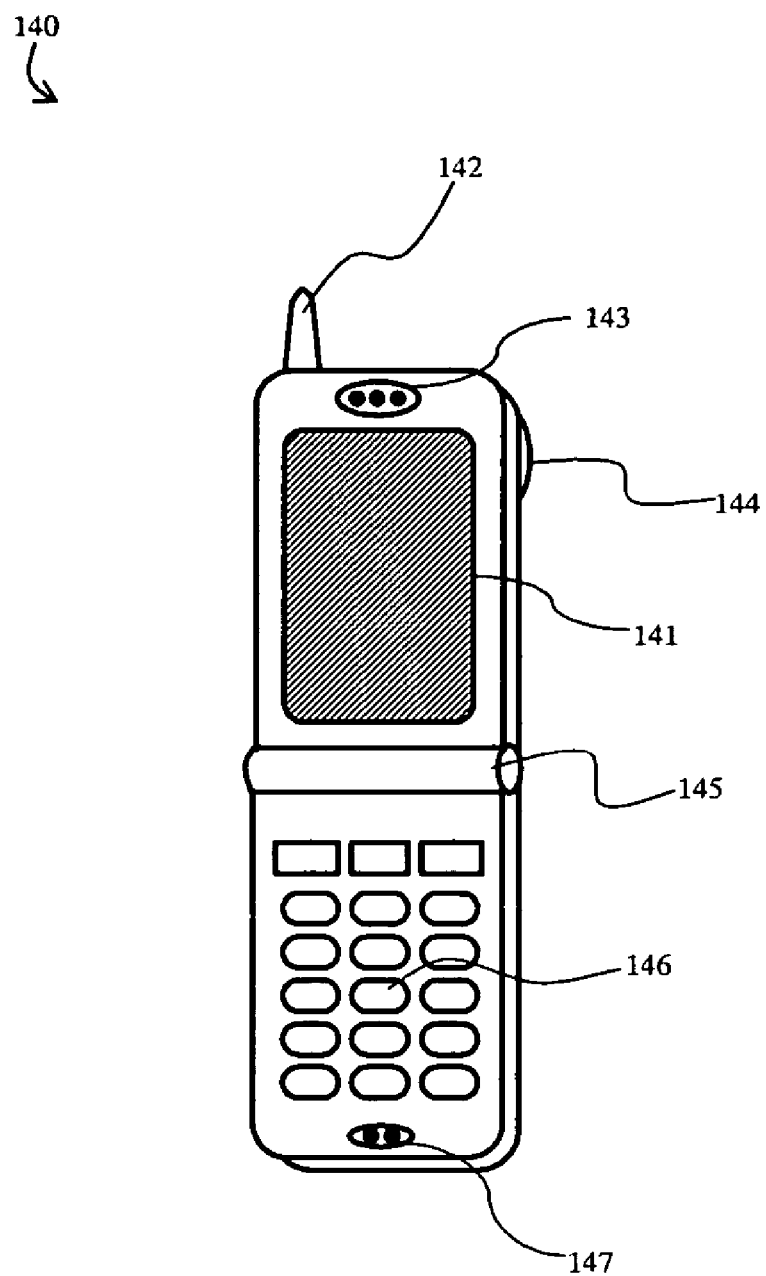
FIG. 18 is a front view schematically showing a cellular phone using TFT of the present embodiment.
Figure 19:
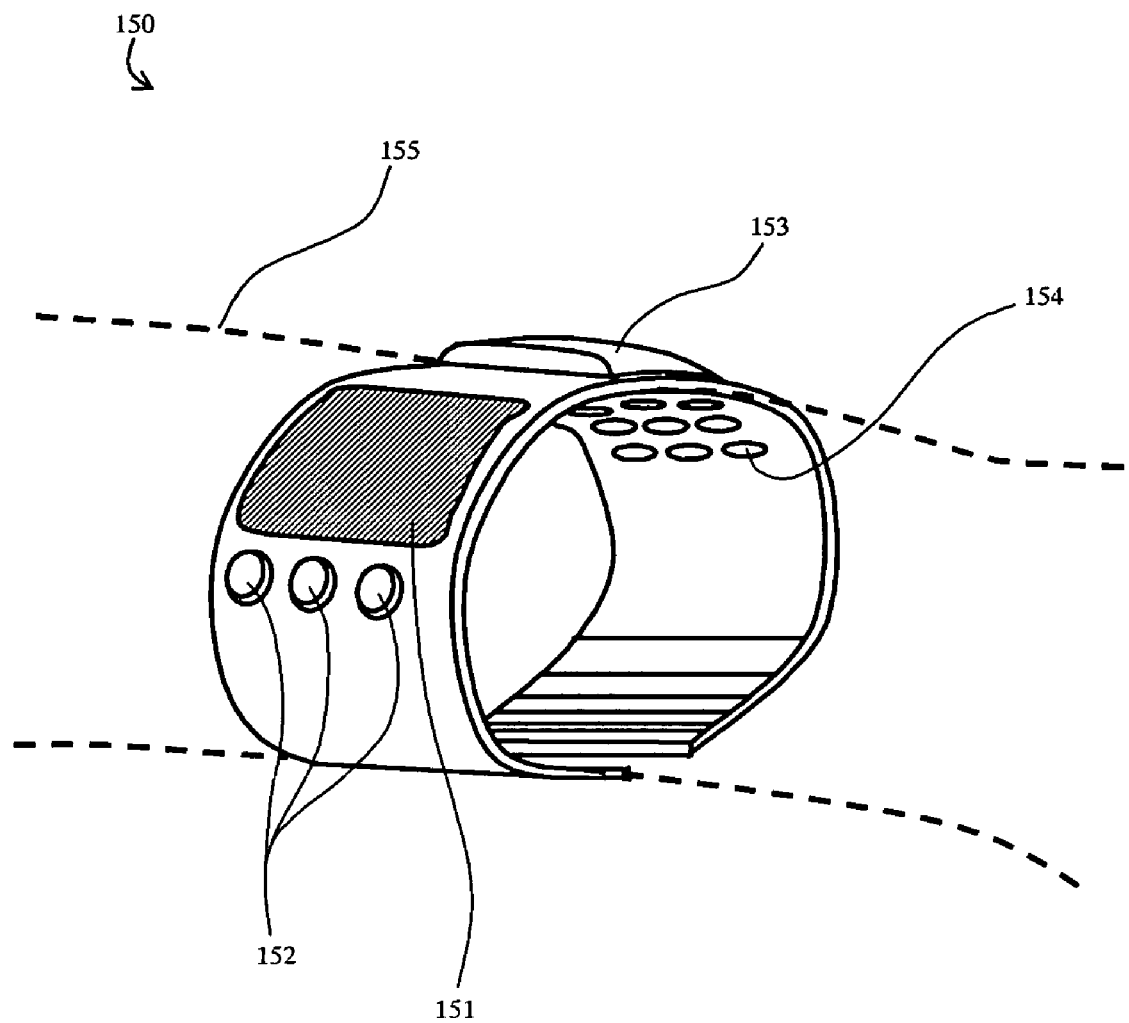
FIG. 19 is a perspective view schematically showing a portable medical device using TFT of the present embodiment.

Finally, application of the TFT of the present invention to portable devices will be explained. FIGS. 17 to 19 show examples of specific applications of the TFT related to the present invention.

An example of application of TFT of the present invention to portable TV will be first explained.

FIG. 17 is a front view schematically showing a portable TV using TFT of the present embodiment.

As shown in FIG. 17, the portable TV 130 of this embodiment comprises a display portion 131 comprising a liquid display device to display TV image, a receiving portion 132 comprising retractable rod antenna to receive airwaves, a power switch 133 for controlling ON/OFF of electric source of the portable TV 130, an operation switch 134 for adjusting and receiving sound output from an after-mentioned sound output device 135, the sound output device 135 comprising a speaker for outputting TV sound, an input/output terminal 136 for inputting and outputting sound signals and picture signals to and from the portable TV 130, and a recording media insertion portion 137 for inserting record media which records necessary sounds and pictures related to the received telecast.

This portable TV 130 builds in integrated circuits, IC and LSI, not shown in FIG. 17. And integrated circuits using TFT of the present invention are properly employed as arithmetic element, memory element, switching element in the portable TV 130. Thereby, the portable TV 130 functions as a portable device for receiving telecast.

Next, application of the TFT of the present invention to a communication terminal will be explained. A cellular phone is illustrated as communication terminal here.

FIG. 18 is a front view schematically showing a cellular phone using TFT of the present embodiment.

As shown in FIG. 18, the cellular phone 140 of the present embodiment comprises a display portion 141 comprising a liquid crystal display device for displaying telephone numbers and the like, a receiving/sending portion 142 capable of receiving/sending communication waves from storable whip antenna, a sound output portion 143 comprising a speaker for outputting communication sound, a camera portion 144 having CCD capable of photographing, a movable folding portion 145 for folding the cellular phone 140 when needed, operation switches 146 for inputting telephone numbers and letters, and a sound input portion 147 comprising a condenser microphone for inputting communication sound.

This cellular phone 140 builds in integrated circuits, IC and LSI, not shown in FIG. 18. And the integrated circuits using TFT of the present invention are properly employed as arithmetic element, memory element, switching element in the cellular phone 140. Thereby, the cellular phone 140 functions as a portable communication terminal.

Next, application of the TFT of the present invention to a portable medical device will be explained.

FIG. 19 is a perspective view schematically showing a portable medical device using TFT of the present embodiment. Illustrated here as an example of portable medical device is a portable medical device which automatically conducts medical treatment such as medicine administration to patients based on obtained body information. In FIG. 19, an arm 155 of after-mentioned patient is perspectively shown.

As shown in FIG. 19, the portable medical device 150 of the present embodiment comprises a display portion 151 comprising a liquid crystal display device for displaying machine action conditions and obtained body information, an operation switch 152 for setting up on actions of the portable medical device 150, a medical treatment portion 153 for processing information obtained through after-mentioned transdermal contact portion 154 and conducting medical treatment such as medical administration to patients based on the processed information through the transdermal contact portion 154, the transdermal contact portion 154 for sequentially collecting information of patients' body for medical treatment and actually conducting medical treatment to the patients.

When this portable medical device 150 is used to conduct medical treatment to patients, the portable medical device 150 is carried while patient's arm 155 being wrapped around with the device 150 as shown in FIG. 19. The transdermal contact portion 154 and the surface of the patient's arm 155 adhere mutually in the state shown in FIG. 19. And the portable medical device 150 collects body information from the arm 155 of the patient in the state shown in FIG. 19 through the transdermal contact portion 154. After the body information is collected, the body information is input into the medical treatment portion 153, where a predetermined process for medical treatment based on the obtained body information is carried out. Then based on the process result, medical treatment such as medicine administration to patient is conducted through the transdermal contact portion 154 by the medical treatment portion 153.

This portable medical device 150 builds in integrated circuits, IC and LSI, not shown in FIG. 19. And the integrated circuits using TFT of the present invention are properly employed as arithmetic element, memory element, switching element in the portable medical device 150. Thereby, the portable medical device 150 functions as a portable medical device.

Thus, through the integrated circuits using TFT explained in the first to third embodiments, the below-mentioned effects are obtained. That means, elements using semiconductor property such as arithmetic element, memory element, and switching element are considered as integrated circuits utilized in the above-mentioned portable devices. Advantages of organic material are considered mechanical flexibility, impact resistance, lightness for environmental consideration in case of disposal and low cost. Using TFT of the present invention, a part of the advantages, it is possible to realize high efficient elements at low cost. As a result, the portable devices having such advantages can be produced at low cost.

In the fourth embodiment, some applications of TFT of the present invention to the portable devices are explained. However, applications are not limited to the configurations explained above. Portable devices applied by the TFT of the present invention are explained above are not limited to the applications mentioned above. For example, portable devices, such as PDA terminals, wearable audio-visual devices, portable computers and watch-type communication devices, requires mechanical flexibility, impact resistance, environmental resistance for disposal, lightness and low cost. TFT of the present invention can be preferably applied to those portable devices.

In the first to third embodiments, the configuration shown in FIG. 1C is applied to TFT of the present invention, but the present invention is also applied to TFT of FIGS. 1A, 1B, 1D, 2A and 2B. In FIG. 1A, a gate electrode 2, a gate insulating layer 3 and a semiconductor layer 4 are laminated on a substrate 1, and a source electrode 5, a drain electrode 6 are laminated on the semiconductor layer 4. In FIG. 1B, a gate electrode 2, a gate insulating layer 3, a source electrode 5 and a drain electrode 6 are laminated on a substrate 1, and a semiconductor layer 4 is laminated on the source electrode 5, the drain electrode 6 and the gate insulating layer 3. In FIG. 1D, a source electrode 5, a drain electrode 6, a semiconductor layer 4 and a gate insulating layer 3 are laminated on a substrate 1, and a gate electrode 2 is laminated on the gate insulating layer 3. In FIG. 2A, a gate electrode 2, a gate insulating layer 3 and a source electrode 5 are laminated on a substrate 1, and a semiconductor layer 4 is laminated on the source electrode 5 and the gate insulating layer 3, and a drain electrode 6 is laminated on the semiconductor layer 4. In FIG. 2B, a source electrode 5 is laminated on a substrate 1, and a semiconductor layer 4 is laminated on the source electrode 5, the semiconductor layer 4 has gate electrode 2 therein having round sectional shape as in FIG. 2B are covered with gate insulating layers 3, and a drain electrode 6 is laminated on the semiconductor layer 4.

The present invention is carried out as mentioned above and provides TFT using semiconductor layers which are constructed by low-price process and which are superior in mechanical flexibility, impact resistance and carrier mobility, and provides a manufacturing method the same. Further, the present invention has effect to provide products having a plurality of TFTs and an active matrix display which have improved carrier mobility and which are inexpensive and excellent in mechanical flexibility and impact resistance. And the present invention provides a radio ID tag and portable devices which use the TFT in an integrated circuit.

It will be understood by the skilled person to carry out and improve the present invention. Therefore, the above explanation should be interpreted just as exemplification and is purposed to teach the best mode to realize the present invention to people skilled in the art. Details of the construction and the function can be substantially modified without departing from the spirit of the invention.

INDUSTRIAL APPLICABILITY

In accordance with the present invention, TFT and method for manufacturing the TFT, which can be formed by low-cost process, is superior in mechanical flexibility and impact resistance and has high carrier mobility, are useful. Further, TFT of the present invention is useful to produce sheet-like or paper-like active matrix displays or portable devices such as radio ID tags, portable TVs and cellular phones.

REFERENCE MARK (1)

1 Substrate
2 Gate electrode
3 Gate insulating layer
4 Semiconductor layer
5 Source electrode
6 Drain electrode 7 Plastic substrate
8 Particles
9 Organic semiconductive material
100 TFT
101 Plastic substrate
102 Organic EL layer
103 Transparent electrode
104 Protective film
105 Source electrode line
106 Gate electrode line
110 TFT drive circuit
111 Gate electrode
112 Gate insulating layer
113 Semiconductor layer
114 Source electrode
115 Drain electrode
116 Pixel electrode
117 Insulating layer
120 Radio ID tag
121 Plastic substrate
122 Atenna portion
123 Memory IC portion
130 Portable TV
131 Display portion
132 Receiving portion
133 Power switch
134 Operation switch
135 Sound output device

REFERENCE MARK (2)

136 Input/output terminal
137 Recording media insertion portion
140 Cellular phone
141 Display portion
142 Receiving/sending portion
143 Sound output portion
144 Camera portion
145 Movable folding portion
146 Operation switch
147 Sound input portion
150 Portable medical device
151 Display portion
152 Operation switch
153 Medical treatment portion
154 Transdermal contact portion
155 Arm
200 TFT
300 Semiconductor property evaluation sample
400 Sectional surface

What is claimed is:

1. A thin-film transistor comprising:
a semiconductor layer, and a source region, a drain region, and a gate region which are formed on the semiconductor layer to be separated from each other; wherein said semiconductor layer is made of composite material, said composite material comprises organic semiconductive material and at least one kind of inorganic material particles dispersed inside the organic semiconductive material, and a content rate of said particles in said semiconductor layer is more than 0 volume % and not more than 60 volume %.

2. The thin-film transistor according to claim 1, wherein an electric resistance of said inorganic material is lower than that of said organic semiconductive material, during ON operation of the thin-film transistor.

3. The thin-film transistor according to claim 1, wherein a maximum particle diameter of said particle is smaller than a distance between said source region and said drain region.

4. The thin-film transistor according to claim 1, wherein a group of said dispersed particles comprises at least first particle group and second particle group, having different average particle diameters.

5. The thin-film transistor according to claim 4, wherein the average particle diameter of said first particle group is more than 0% and less than 15% of the average particle diameter of said second particle group.

6. The thin-film transistor according to claim 1, wherein said inorganic material is a conductive material.

7. The thin-film transistor according to claim 1, wherein said inorganic material is a semiconductive material.

8. The thin-film transistor according to claim 1, wherein said inorganic material is a composite material of two or more materials containing a conductive material and a semiconductive material.

9. An active matrix display, wherein a plurality of the thin-film transistors according to claim 1 are provided as switching elements for driving pixels.

10. A radio ID tag, wherein the thin-film transistor according to claim 1 is used as a semiconductor device for forming an integrated circuit.

11. A portable device, wherein the thin-film transistor according to claim 1 is used as a semiconductor device for forming an integrated circuit.

12. A method of manufacturing a thin-film transistor comprising a semiconductor layer, and a source region, a drain region and a gate region which are formed on the semiconductor layer to be separated from each other, comprising:
a first step of forming composite material by dispersing at least one kind of inorganic material particles inside an organic semiconductive material such that a content rate of said particles is more than 0 volume % and not more than 60 volume %, and
a second step of forming said semiconductor layer using said composite material produced in the first step.

13. The method of manufacturing a thin-film transistor according to claim 9, wherein an electric resistance of said inorganic material is lower than that of said organic semiconductive material, during ON operation of the thin-film transistor.

14. The method of manufacturing a thin-film transistor according to claim 12, further comprising a step of selecting particles so as to form a predetermined particle size distribution.

15. The method of manufacturing a thin-film transistor according to claim 12, further comprising a step of controlling dispersion so as to form a predetermined particle dispersion condition in said semiconductor layer.

16. The method of manufacturing a thin-film transistor according to claim 12, wherein said second step further comprising, a first preparation step of dispersing said composite material in a predetermined solution dissolved or undissolved to obtain a semiconductor layer forming material, and a second preparation step of atomizing, coating, or printing said semiconductor layer forming material prepared in said first preparation step to a predetermined location, and then drying the material to form said semiconductor layer.

* * * * *